United States Patent
Chae et al.

(10) Patent No.: US 10,447,258 B2
(45) Date of Patent: Oct. 15, 2019

(54) CIRCUIT AND SYSTEM FOR DRIVING SWITCHING MODULES

(71) Applicant: LG ELECTRONICS INC., Seoul (KR)

(72) Inventors: Seungwoo Chae, Seoul (KR); Sanghyeon Kim, Seoul (KR); Jeongeon Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/848,826

(22) Filed: Dec. 20, 2017

(65) Prior Publication Data

US 2018/0183425 A1    Jun. 28, 2018

(30) Foreign Application Priority Data

Dec. 22, 2016 (KR) .................. 10-2016-0177023

(51) Int. Cl.
| | |
|---|---|
| H03K 17/08 | (2006.01) |
| H03K 17/082 | (2006.01) |
| H03K 17/14 | (2006.01) |
| G01R 19/00 | (2006.01) |
| H03K 17/567 | (2006.01) |

(52) U.S. Cl.
CPC ......... *H03K 17/08* (2013.01); *G01R 19/0092* (2013.01); *H03K 17/0828* (2013.01); *H03K 17/14* (2013.01); *H03K 17/567* (2013.01); *H03K 2217/0027* (2013.01)

(58) Field of Classification Search
CPC .............. H03K 17/08; H03K 17/0806; H03K 17/0812; H03K 17/08104; H03K 17/14
See application file for complete search history.

(56) References Cited

U.S. PATENT DOCUMENTS

| | | | |
|---|---|---|---|
| 8,362,812 B2 * | 1/2013 | Lee | H02M 1/08 327/109 |
| 8,598,942 B2 * | 12/2013 | Kawashima | G01R 19/32 327/513 |
| 2005/0128671 A1 | 6/2005 | Miyamoto | |
| 2006/0214704 A1 | 9/2006 | Nakano | |
| 2010/0237927 A1 | 9/2010 | Martin | |
| 2013/0257517 A1 | 10/2013 | Kawashima | |
| 2016/0173094 A1 | 6/2016 | Choi | |

FOREIGN PATENT DOCUMENTS

| | | |
|---|---|---|
| GB | 2509987 | 7/2014 |
| JP | 2005-175741 | 6/2005 |
| JP | 5063124 | 10/2012 |
| KR | 10-2016-0070516 | 6/2016 |

OTHER PUBLICATIONS

European Search Report dated Apr. 30, 2018 issued in Application No. 17206387.7.
Korean Office Action issued in Application 10-2016-0177023 dated Sep. 11, 2017 (full Korean text).

* cited by examiner

*Primary Examiner* — Hai L Nguyen
(74) *Attorney, Agent, or Firm* — KED & Associates LLP

(57) ABSTRACT

A circuit and a system may drive switching modules. The driving circuit and system are capable of controlling a detection level of a protection voltage of a switching module, by controlling a voltage of a detection circuit for detecting the protection voltage. This may be done based on control of a variable resistance.

16 Claims, 5 Drawing Sheets

FIG. 8

| DIVISION | -20 ℃ | -10 ℃ | 0 ℃ | ~ | 130 ℃ | 40 ℃ | 150 ℃ |
|---|---|---|---|---|---|---|---|
| 13V | 2.1kΩ | 2.05kΩ | 2.01kΩ | ... | 1.87kΩ | 1.65kΩ | 1.52kΩ |
| 13.5V | 2.2kΩ | ... | ... | ... | ... | ... | ... |
| 14V | 2.3kΩ | ... | ... | ... | ... | ... | ... |
| ~ | ... | ... | ... | ... | ... | ... | ... |
| 17V | 2.5kΩ | ... | ... | ... | 2.2kΩ | ... | ... |
| 17.5V | 2.6kΩ | ... | ... | ... | ... | ... | ... |
| 18V | 2.9kΩ | ... | ... | ... | ... | ... | ... |

CIRCUIT AND SYSTEM FOR DRIVING SWITCHING MODULES

CROSS-REFERENCE TO RELATED APPLICATION

This application claims priority under 35 U.S.C. § 119 to Korean Application No. 10-2016-0177023, filed Dec. 22, 2016, the subject matter of which is hereby incorporated by reference.

BACKGROUND

1. Field

This disclosure relates to a circuit and a system for driving switching modules. More particularly, this disclosure relates to a circuit and a system for driving and protecting one or more switching modules included in a power conversion apparatus.

2. Background

In a driving system to which an insulated gate bipolar transistor (IGBT) is applied, a saturation voltage Vice(Sat) between a collector and an emitter, which is proportional to a current generated when the IGBT is turned on, may be used to sense a current increase into more than a predetermined value and to prevent an over-current, thereby protecting a switch. However, the saturation voltage (Vce) is variable according to a driving condition (i.e., a gating voltage or a junction temperature), and the saturation voltage has a difficulty in being operated at a precise current level desired by a user, due to its low accuracy.

FIG. 1 shows a configuration of an IGBT module driving system according to an example arrangement. Other arrangements may also be provided.

As shown in FIG. 1, the IGBT module driving system 100 may include one or more IGBT devices 112, a PTC thermistor 120 having its resistance value changed according to a temperature change of the IGBT devices 112, an IGBT module 110 (including a connection circuit 140 that connects the IGBT device 112 to a drive IC 130), and the drive IC 130 that operates by a microcomputer and is configured to drive the IGBT module 110. The drive IC 130 may detect a DESAT voltage for detecting a saturation voltage (Vce) by using a current source 134, thereby detecting a saturation state of the IGBT device 110. The drive IC 130 may restrict an operation of the IGBT device 110 as a protection circuit 132 is operated according to a detection result.

In the IGBT module driving system 100, a protection circuit function utilizing a DESAT function of the drive IC 130 is performed as an offset voltage for detecting a DESAT voltage is set through a resistance and a diode included in the connection circuit 140. This may be performed at the time of an initial design, and it may not be possible to control the offset voltage later due to characteristics of the resistance and the diode. However, an operable region of the IGBT is variable according to a change of an inner temperature (i.e., a junction temperature), and the saturation voltage (Vce) may also be variable according to a driving condition of the IGBT (e.g., an inner temperature and a gating voltage). Thus, if a fixed voltage (Vce) is detected, a current detected from a threshold value has a size change according to a driving condition.

That is, in the IGBT module driving system 100, the offset voltage for detecting the saturation voltage (Vce) is set when the system is manufactured. As a result, it may not be possible to control a detection current level according to a driving condition. Further, since the DESAT voltage is set to have a predetermined value, a protection operation may occur at a value higher or lower than a desired value if a driving condition is changed. This may cause a precise and proper protection not to be ensured.

BRIEF DESCRIPTION OF THE DRAWINGS

Arrangements and embodiments may be described in detail with reference to the following drawings in which like reference numerals refer to like elements and wherein:

FIG. 8 is an exemplary view showing a preset table reference of a circuit and a system for driving a switching module according to an example embodiment.

DETAILED DESCRIPTION

Figure 1:
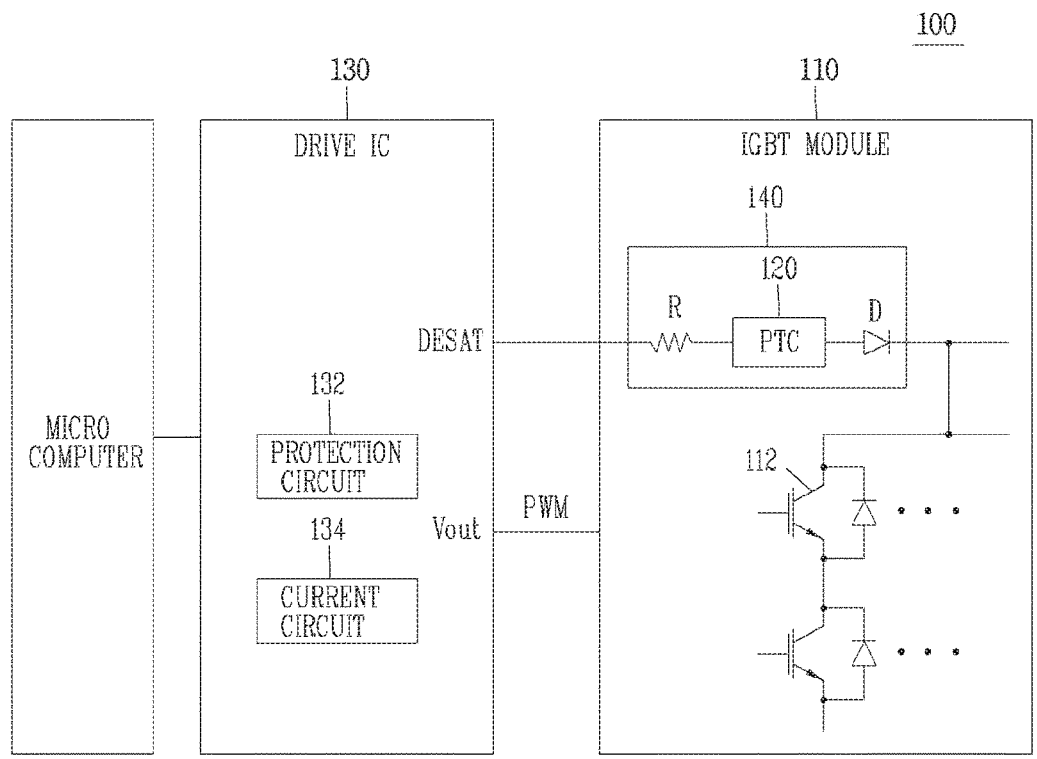
FIG. 1 shows a configuration of an IGBT module driving system according to an example arrangement.

A circuit and a system for driving a switching module disclosed in this disclosure may be applicable to a circuit for driving a switching module, a module or an apparatus including the same. The circuit and the system for driving a switching module may be applicable to a circuit for controlling a switching module, a driving circuit including a switching module, etc. The circuit and the system for driving a switching module may be applicable to a power conversion apparatus for converting a power through a switching module.

Unless differently defined, all terms used herein with including technical or scientific terms have the same meaning as terms generally understood by those skilled in the art relating to the field of the present disclosure. Terms defined in a general dictionary should be understood so as to have the same meanings as contextual meanings of related art. Unless definitely defined in the present disclosure, terms are not interpreted as ideal or excessively formal meanings. Further, when the technical terms used in the present disclosure are unsuitable technical terms that do not precisely express techniques of the present disclosure, the unsuitable technical terms should be replaced by suitable technical terms that can be understood by those skilled in the art. The general terms used in the present disclosure should be interpreted based on the previous or next contexts, but should not be interpreted as an excessively narrowed meaning.

A singular expression includes a plural concept unless there is a contextually distinctive difference therebetween. In the present disclosure, a term of "include" or "have" should not be interpreted as if it absolutely includes a plurality of components or steps of the specification. Rather, the term of "include" or "have" may not include some components or some steps, or may further include additional components.

If it is regarded that detailed descriptions are not within the range of the present disclosure, detailed descriptions may be omitted. Further, it should also be understood that embodiments are not limited by any of the details of the attached drawings, but rather should be construed broadly within its spirit and scope and it is intended that the present disclosure cover modifications and variations of this disclosure provided they come within the scope of the appended claims and their equivalents.

The circuit and the system for driving a switching module according to the present disclosure may be explained in more detail with reference to FIGS. 2 to 8.

The circuit for driving a switching module (hereinafter referred to as a driving circuit) may be a driving circuit (or driving device) of a switching module that converts a power through a switching operation.

The driving circuit may be a circuit, a device, a module and/or an apparatus for controlling a driving of one or more switching modules.

The driving circuit may be a circuit for driving and protecting one or more switching modules.

That is, the driving circuit may be a circuit for controlling a driving of one or more switching modules, and for protecting the switching modules.

The driving circuit may be included in an apparatus including one or more switching modules.

The driving circuit may be a switching module driving circuit included in a power conversion apparatus, such as a converter/inverter.

Figure 2:
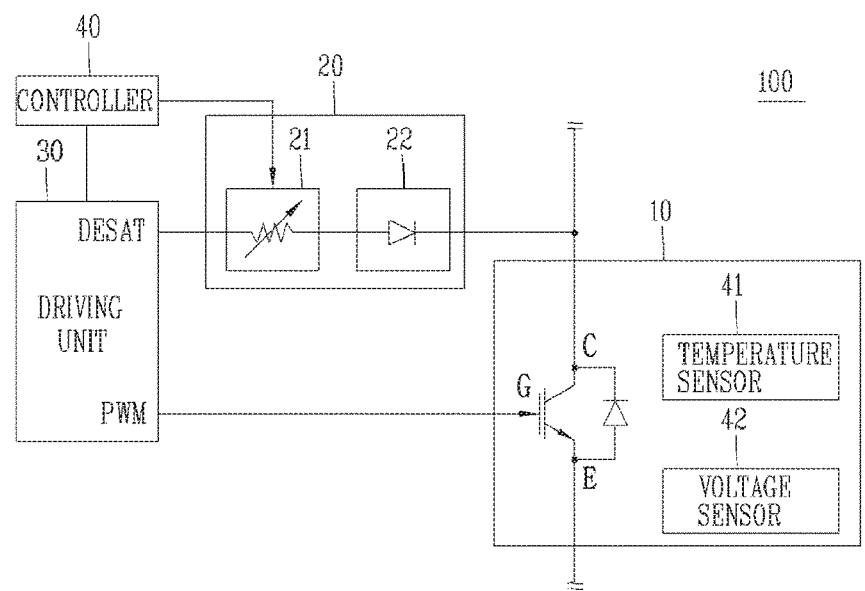
FIG. 2 is a view of a circuit and a system for driving a switching module according to an example embodiment.

The driving circuit may have a configuration shown in FIG. 2.

FIG. 2 shows a circuit and a system for driving a switching module according to an example embodiment. Other embodiments and configurations may also be provided.

As shown in FIG. 2, the driving circuit 100 (or driving device) includes a detection circuit 20 (or detection device), a driving unit 30 (or a driving device) and a controller 40, thereby driving one or more switching modules 10.

The switching module 10 may be a semiconductor switching module for converting power through a switching operation.

The switching module 10 may operate based on a driving signal received from the driving unit 30 (or the driving device).

The switching module 10 may be (or include) an insulated gate bipolar transistor (IGBT) module.

The switching module 10 may be composed of a gate (G), a collector (C) and an emitter (E). The gate (G) may be connected to the driving unit 30, and the collector (C) may be connected to the detection circuit 20.

As the switching module 10 is driven by receiving the driving signal at the gate (G) connected to the driving unit 30, current may flow between the collector (C) and the emitter (E).

When the switching module 10 is driven by the driving signal, heat may occur based on the driving signal, the switching operation and the flowing current. A voltage may be applied between the gate (G) and the emitter (E), or between the collector (C) and the emitter (E).

The detection circuit 20 is a circuit (or device) to detect a protection voltage for protecting the switching module 10.

The detection circuit 20 may be connected to the switching module 10 and the driving unit 30 in order to detect the protection voltage.

The detection circuit 20 may be connected between the collector (C) of the switching module 10 and the driving unit 30.

The detection circuit 20 may be connected to the driving unit 30 by being connected to a DESAT pin (or port) (of the driving unit 30) for detecting the protection voltage of the driving unit 30.

When current flows, the detection circuit 20 may have a voltage applied by the flowing current.

The detection circuit 20 may include a variable resistance 21 having a resistance value that is variable based on the controller 40.

The variable resistance 21 may be a digital variable resistance.

The variable resistance 21 may have a resistance value be variable based on the controller 40, thereby changing a voltage applied to the detection circuit 20.

The detection circuit 20 may include the variable resistance 21, and may include one or more resistances or diode devices 22.

Figure 3:
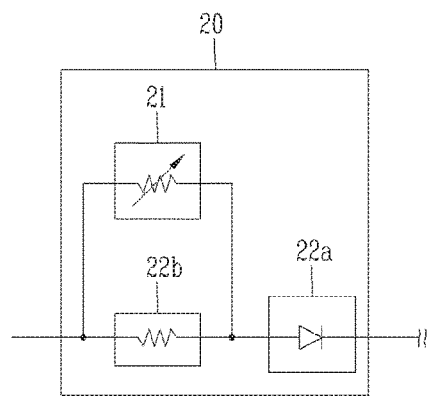
FIG. 3 is a first configuration view showing a detection circuit of a circuit and a system for driving a switching module according to an example embodiment.

FIG. 3 is a first configuration view showing a detection circuit of a circuit and a system for driving a switching module according to an example embodiment. Other embodiments and configurations may also be provided.

Figure 4:
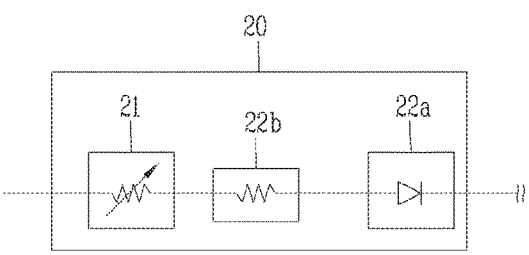
FIG. 4 is a second configuration view showing a detection circuit of a circuit and a system for driving a switching module according to an example embodiment.

FIG. 4 is a second configuration view showing a detection circuit of a circuit and a system for driving a switching module according to an example embodiment. Other embodiments and configurations may also be provided.

As shown in FIGS. 3 and 4, the detection circuit 20 may include a fixed resistance 22b having a fixed resistance value, and a diode 22a for limiting a current flow.

As shown in FIG. 3, the variable resistance 21 and the fixed resistance 22b may be connected to each other in parallel. Alternatively, as shown in FIG. 4, the variable resistance 21 and the fixed resistance 22b may be connected to each other in series.

The detection circuit 20 may include the variable resistance 21, the fixed resistance 22b or the diode 22a such that a voltage applied to the detection circuit 20 may be determined by the devices (or components).

That is, the voltage applied to the detection circuit 20 may be a voltage for detecting the protection voltage.

The protection voltage may be a voltage detected from the driving unit 30 in order to protect the switching module 10.

The protection voltage may be a voltage detected in order to protect the switching module 10 from an over-current, according to whether a saturation occurs (or not) between the collector (C) and the emitter (E) of the switching module 10.

That is, the protection voltage may be a voltage for determining whether a saturation occurs (or not) between the collector (C) and the emitter (E) of the switching module 10.

Figure 5:
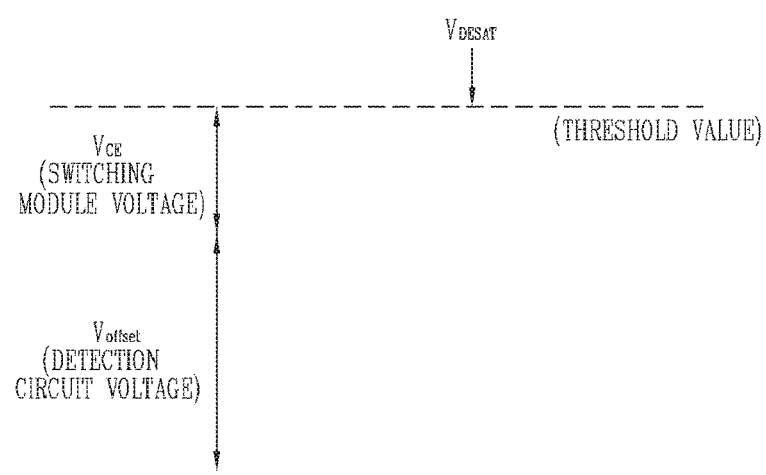
FIG. 5 is a conceptual view showing a voltage detection level controlling concept of a circuit and a system for driving a switching module according to an example embodiment.

FIG. 5 is a conceptual view showing a voltage detection level controlling concept of a circuit and a system for driving a switching module according to an example embodiment. Other embodiments and configurations may also be provided.

As shown in FIG. 5, a protection voltage ($V_{DESAT}$) may be a voltage obtained by adding a voltage ($V_{offset}$) applied to the detection circuit 20 to a saturation voltage ($V_{CE}$) between the collector (C) and the emitter (E) of the switching module 10.

That is, the protection voltage may be detected by detecting the voltage applied to the detection circuit 20 and the saturation voltage between the collector (C) and the emitter (E) of the switching module 10.

The voltage applied to the detection circuit 20 may be an offset voltage for detecting the saturation voltage between the collector (C) and the emitter (E) of the switching module 10. That is, the voltage may be a detection level voltage for detecting the protection voltage.

The driving unit 30 may be configured to: generate a driving signal for driving the switching module 10; output the driving signal to the switching module 10; detect the protection voltage through the detection circuit 20; and protect the switching module 20 based on a detection result.

The driving unit 30 may be controlled by the controller 40.

The driving unit 30 may be controlled by the controller 40, and the driving unit 30 may be configured to generate the driving signal and to output the driving signal to the switching module 10.

The driving signal may be a signal with respect to a switching operation of the switching module 10.

The driving signal may be a pulse width modulation (PWM) signal.

The driving unit 30 may be connected to the gate (G) of the switching module 10 through a PWM pin (or port) (of the driving unit) that outputs the driving signal.

The driving unit 30 may generate the driving signal, and the driving unit 30 may output the driving signal to the gate (G) of the switching module 10 to drive the switching module 10.

The driving unit 30 may apply a detection current for detecting the protection voltage to the detection circuit 20, thereby detecting the protection voltage based on a flow result of the detection current on the detection circuit 20 and the switching module 10.

That is, the driving unit 30 may detect a voltage applied to the detection circuit 20 as the detection current flows on the detection circuit 20 and the switching module 10, and the driving unit 30 may detect a saturation voltage between the collector (C) and the emitter (E) of the switching module 10. The driving unit 30 may detect the protection voltage by adding the detected two voltages to each other.

The driving unit 30 may detect the protection voltage through the detection circuit 20, thereby monitoring the switching module 10.

The driving unit 30 may monitor the saturation voltage between the collector (C) and the emitter (E) of the switching module 10.

The driving unit 30 may compare the detection result of the protection voltage with a preset reference value, thereby limiting an output of the driving signal according to a comparison result.

That is, the driving unit 30 may compare the detection result with the preset reference value to limit an output of the driving signal, thereby protecting the switching module 10.

The preset reference value may be a reference value of the protection voltage.

The preset reference value may be a reference voltage for determining a saturation state of the switching module 10.

If the detection result exceeds the preset reference value as a comparison result, the driving unit 30 may limit an output of the driving signal.

That is, if the detection result exceeds the preset reference value, the driving unit 30 may limit an output of the driving signal by determining that the switching module 10 is in a saturation state.

The controller 40 may generate a command signal with respect to generation of the driving signal, and the controller 40 may transmit the command signal to the driving unit 30.

That is, the controller 40 may control the switching module 10 by controlling the driving unit 30.

The controller 40 may control a resistance value of the variable resistance 21 included in the detection circuit 20, to be variable.

The controller 40 may change the resistance value of the variable resistance 21 according to a driving condition of the switching module 10, thereby controlling a detection level of the protection voltage.

The driving condition may be an inner temperature of the switching module 10, or may be a gating voltage between the gate (G) and the emitter (E) of the switching module 10.

Figure 6:
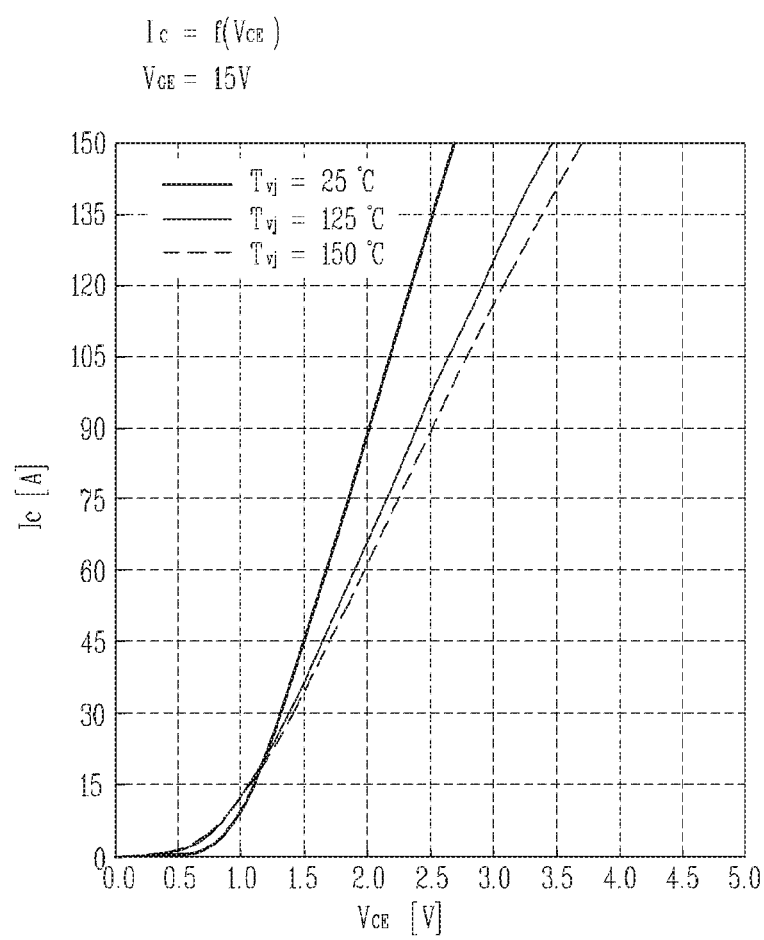
FIG. 6 is an exemplary view showing that a switching module has a voltage change according to an inner temperature of a circuit and a system for driving a switching module according to an example embodiment.

FIG. 6 is an exemplary view showing that a switching module has a voltage change according to an inner temperature of a circuit and a system for driving a switching module according to an example embodiment. Other embodiments and configurations may also be provided.

As shown in FIG. 6, a saturation voltage ($V_{CE}$) between the collector (C) and the emitter (E) of the switching module 10 is variable according to an inner temperature ($T_{vj}$) of the switching module 10. Accordingly, whether a saturation occurs (or not) between the collector (C) and the emitter (E) of the switching module 10 may be determined according to the inner temperature ($T_{vj}$) of the switching module 10.

For example, if the inner temperature ($T_{vj}$) of the switching module 10 is 25° C., the saturation voltage ($V_{CE}$) between the collector (C) and the emitter (E) of the switching module 10 for flowing a collector current (IC) of 90 Å may be 2.0V. However, if the inner temperature ($T_{vj}$) of the switching module 10 is 150° C., the saturation voltage ($V_{CE}$) between the collector (C) and the emitter (E) of the switching module 10 for flowing the collector current (IC) of 90 Å may be 2.5V.

Figure 7:
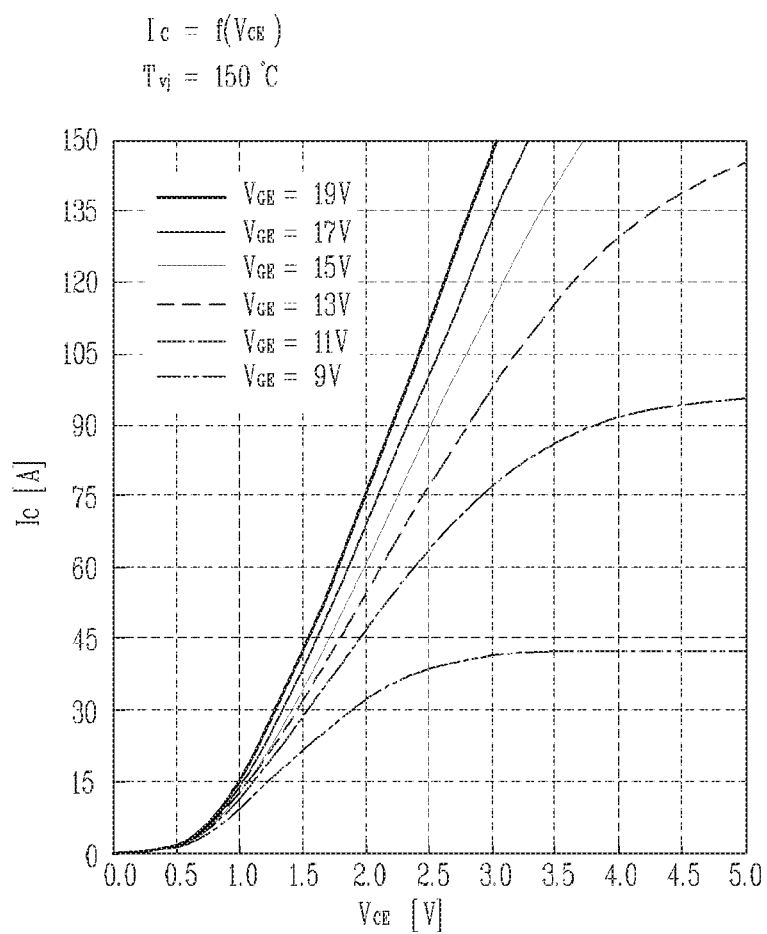
FIG. 7 is an exemplary view showing that a switching module has a voltage change according to a gating voltage of a circuit and a system for driving a switching module according to an example embodiment.

FIG. 7 is an exemplary view showing that a switching module has a voltage change according to a gating voltage of a circuit and a system for driving a switching module according to an example embodiment. Other embodiments and configurations may also be provided.

As shown in FIG. 7, the saturation voltage ($V_{CE}$) between the collector (C) and the emitter (E) of the switching module 10 is also variable according to a gating voltage ($V_{GE}$) between the gate (G) and the emitter (E) of the switching module 10. Accordingly, whether a saturation occurs (or not) between the collector (C) and the emitter (E) of the switching module 10 may be differently determined according to the gating voltage ($V_{GE}$) of the switching module 10.

For example, if the gating voltage ($V_{GE}$) of the switching module 10 is 15V, the saturation voltage ($V_{CE}$) between the collector (C) and the emitter (E) of the switching module 10 for flowing the collector current (IC) of 90 Å may be 2.5V. However, if the gating voltage ($V_{GE}$) of the switching module 10 is 11V, the saturation voltage ($V_{CE}$) between the collector (C) and the emitter (E) of the switching module 10 for flowing the collector current (IC) of 90 Å may be 3.8V.

The saturation voltage ($V_{CE}$) between the collector (C) and the emitter (E) of the switching module 10 is variable according to an inner temperature of the switching module 10, or a gating voltage ($V_{GE}$) of the switching module 10. Accordingly, the protection voltage, the sum between a voltage applied to the detection circuit 20 and the saturation voltage between the collector (C) and the emitter (E) of the switching module 10 is also variable.

In this example, whereas the voltage applied to the detection circuit 20 is maintained, the saturation voltage between the collector (C) and the emitter (E) of the switching module 10 is increased or decreased. As a result, since a detection level of the protection voltage for determining a saturation state of the switching module 10 is increased or decreased, whether the switching module 10 has been saturated (or not) cannot be precisely determined.

That is, as the saturation voltage between the collector (C) and the emitter (E) of the switching module 10 is increased or decreased according to an inner temperature of the switching module 10 or a gating voltage of the switching module 10, the protection voltage is increased or decreased. In this example, the protection voltage may be more than or less than the preset reference value, regardless of whether the switching module 10 has been saturated or not. This may cause the switching module 10 not to be precisely protected.

In order to solve such a problem of a detection level change according to the driving condition, the controller 40 changes a resistance value of the variable resistance 21 according to an inner temperature or a gating voltage of the switching module 10, and controls a voltage applied to the detection circuit 20. That is, as shown in FIG. 5, as the controller 40 controls the voltage applied to the detection circuit 20 by a change amount of the saturation voltage between the collector (C) and the emitter (E) of the switching module 10, a detection level of the protection voltage may be controlled.

The driving circuit 100 may include a temperature sensor 41 for detecting an inner temperature of the switching module 10, and/or a voltage sensor 42 for detecting a gating voltage between the gate (G) and the emitter (E) of the switching module 10. The controller 40 may receive information on the driving condition from the temperature sensor 41 and/or the voltage sensor 42.

The controller 40 may receive information on an inner temperature or a gating voltage of the switching module 10 that corresponds to the driving condition, from the temperature sensor 41 and/or the voltage sensor 42, thereby changing a resistance value of the variable resistance 21.

The controller 40 may receive information on the inner temperature of the switching module 10 from the temperature sensor 41, thereby monitoring the information. The controller 140 may change the resistance value of the variable resistance 21 according to a change of the inner temperature of the switching module 10.

The controller 40 may receive information on the gating voltage of the switching module 10 from the voltage sensor 42, thereby monitoring the information. The controller 140 may change the resistance value of the variable resistance 21 according to a change of the gating voltage of the switching module 10.

The controller 40 may monitor the inner temperature change or the gating voltage change of the switching module 10, thereby changing the resistance value of the variable resistance 21. This may allow a detection level of the protection voltage to be controlled according to a driving condition of the switching module 10.

For example, if the saturation voltage between the collector (C) and the emitter (E) of the switching module 10 is increased to 2.5V from 2.0V according to a change of the driving condition, the resistance value of the variable resistance 21 is changed such that the voltage applied to the detection circuit 20 is decreased by 0.5V. This may allow the detection level of the protection voltage to be controlled.

As another example, if the saturation voltage between the collector (C) and the emitter (E) of the switching module 10 is decreased to 2.0V from 2.5V according to a change of the driving condition, the resistance value of the variable resistance 21 is changed such that the voltage applied to the detection circuit 20 is increased by 0.5V. This may allow the detection level of the protection voltage to be controlled.

The controller 40 may compare the driving condition with a pre-stored table reference, and may change the resistance value of the variable resistance 21 into a value which is based on a comparison result.

FIG. 8 is an exemplary view showing a preset table reference of a circuit and a system for driving a switching module according to an example embodiment. Other embodiments and configurations may also be provided.

As shown in FIG. 8, the pre-stored table reference may be a reference value stored as resistance values of the variable resistance 21 are implemented in the form of a table according to the inner temperature or the gating voltage of the switching module 10.

Referring to FIG. 8, if the inner temperature of the switching module 10 is 130° C. and the gating voltage of the switching module 10 is 17V, the resistance value of the variable resistance 21 may be changed into 2.2 kΩ.

The controller 40 may calculate the resistance value of the variable resistance 21 based on a numeric value of the driving condition, and may change the resistance value of the variable resistance 21 to the calculated resistance value.

In this example, the resistance value of the variable resistance 21 may be calculated by the controller 40 according to a calculating formula preset to the controller 40, the calculating formula for calculating the resistance value of the variable resistance 21 by having the inner temperature or the gating voltage of the switching module 10 as parameters.

The system for driving a switching module (hereinafter referred to as a driving system) may be a system for driving a switching module that converts a power through a switching operation.

The driving system maybe a circuit system of a circuit, a module or an apparatus for controlling a driving of one or more switching modules.

The driving system maybe an apparatus for converting a power through one or more switching modules, or a driving system of such an apparatus.

The driving system may be a circuit system for driving and protecting one or more switching modules.

That is, the driving system may be a driving apparatus for controlling a driving of one or more switching modules and protecting the switching modules, or may be a driving system applied to such an apparatus.

The driving system may be applied to an apparatus including one or more switching modules.

The driving system may be applied to a power conversion apparatus such as a converter/inverter.

The driving system may include the aforementioned driving circuit 100 (hereafter also referred to as the driving system). For ease of illustration, the driving system may include components or operations discussed above with respect to FIGS. 2-8.

The driving system may have a configuration shown in FIG. 2, for example.

As aforementioned, the driving circuit and the driving system 100 changes the resistance value of the variable resistance 21, according to the inner temperature or the gating voltage of the switching module 10. As a result, since a voltage applied to the detection circuit 20 and corresponding to an offset voltage is controllable at the protection voltage, a detection level of the protection voltage may be controlled.

An aspect of the detailed description is to provide a switching module driving circuit capable of controlling a voltage detection level of a switching module, and a driving system.

Another aspect of the detailed description is to provide a switching module driving circuit capable of accurately determining a saturation state when a driving condition of the switching module is changed, and capable of protecting the switching module accurately and properly, and a driving system.

Another aspect of the detailed description is to provide a circuit and a system for driving switching modules, capable of controlling a detection level of a protection voltage of a switching module, by controlling a voltage of a detection circuit for detecting the protection voltage.

More specifically, the detection circuit may include a variable resistance, and a resistance value of the variable resistance is controlled to control a detection level of the protection voltage.

To achieve these and other advantages and in accordance with the purpose of this specification, as embodied and broadly described herein, there is provided a circuit for driving a switching module, comprising: a detection circuit configured to detect a protection voltage for protecting a switching module; a driving unit configured to generate a driving signal for driving the switching module, to output the driving signal to the switching module, to detect the protection voltage through the detection circuit, and to protect the switching module based on a detection result; and a controller configured to generate a command signal with respect to generation of the driving signal, and transmit the command signal to the driving unit, wherein the detection circuit includes a variable resistance having its resistance value variable by the controller, and wherein the controller controls a detection level of the protection voltage by changing a resistance value of the variable resistance according to a driving condition of the switching module.

In an embodiment, the switching module may be an insulated gate bipolar transistor (IGBT) module.

In an embodiment, the detection circuit may be connected between a collector of the switching module and the driving unit.

In an embodiment, the detection circuit may further include one or more passive elements.

In an embodiment, the protection voltage may be a voltage obtained by adding a voltage applied to the detection circuit to a saturation voltage between a collector and an emitter of the switching module.

In an embodiment, the driving unit may apply a detection current for detecting the protection voltage to the detection circuit, and may detect the protection voltage based on a flow result of the detection current on the detection circuit and the switching module.

In an embodiment, the driving unit may compare the detection result with a preset reference value, and may limit an output of the driving signal according to a comparison result.

In an embodiment, the driving condition may be an inner temperature of the switching module, or may be a gating voltage between a gate and an emitter of the switching module.

In an embodiment, the driving circuit may further include a temperature sensor for detecting an inner temperature of the switching module, or a voltage sensor for detecting a gating voltage of the switching module, and the controller may receive information on the driving condition from the temperature sensor or the voltage sensor.

In an embodiment, the controller may receive information on the inner temperature of the switching module from the temperature sensor, monitor the information, and change the resistance value of the variable resistance according to a change of the inner temperature of the switching module.

In an embodiment, the controller may receive information on the gating voltage of the switching module from the voltage sensor, monitor the information, and change the resistance value of the variable resistance according to a change of the gating voltage of the switching module.

In an embodiment, the controller may compare the driving condition with a pre-stored table reference, and may change the resistance value of the variable resistance into a value which is based on a comparison result.

In an embodiment, the controller may calculate the resistance value of the variable resistance based on a numeric value of the driving condition, and may change the resistance value of the variable resistance to the calculated resistance value.

To achieve these and other advantages and in accordance with the purpose of this specification, as embodied and broadly described herein, there is also provided a system for driving a switching module, comprising: a detection circuit configured to detect a protection voltage for protecting a switching module; a driving unit configured to generate a driving signal for driving the switching module, to output the driving signal to the switching module, to detect the protection voltage through the detection circuit, and to protect the switching module based on a detection result; and a controller configured to generate a command signal with respect to generation of the driving signal, and transmit the command signal to the driving unit, wherein the detection circuit includes a variable resistance having its resistance value variable by the controller, and wherein the controller controls a detection level of the protection voltage by changing a resistance value of the variable resistance according to a driving condition of the switching module.

In an embodiment, the switching module may be an insulated gate bipolar transistor (IGBT) module.

In an embodiment, the detection circuit may be connected between a collector of the switching module and the driving unit.

In an embodiment, the detection circuit may further include one or more passive elements.

In an embodiment, the protection voltage may be a voltage obtained by adding a voltage applied to the detection circuit to a saturation voltage between a collector and an emitter of the switching module.

In an embodiment, the driving unit may apply a detection current for detecting the protection voltage to the detection circuit, and may detect the protection voltage based on a flow result of the detection current on the detection circuit and the switching module.

In an embodiment, the driving unit may compare the detection result with a preset reference value, and may limit an output of the driving signal according to a comparison result.

In an embodiment, the driving condition may be an inner temperature of the switching module, or may be a gating voltage between a gate and an emitter of the switching module.

In an embodiment, the driving system may further include a temperature sensor for detecting an inner temperature of the switching module, or a voltage sensor for detecting a gating voltage of the switching module, and the controller may receive information on the driving condition from the temperature sensor or the voltage sensor.

In an embodiment, the controller may receive information on the inner temperature of the switching module from the temperature sensor, monitor the information, and change the resistance value of the variable resistance according to a change of the inner temperature of the switching module.

In an embodiment, the controller may receive information on the gating voltage of the switching module from the voltage sensor, monitor the information, and change the resistance value of the variable resistance according to a change of the gating voltage of the switching module.

In an embodiment, the controller may compare the driving condition with a pre-stored table reference, and may change the resistance value of the variable resistance into a value which is based on a comparison result.

In an embodiment, the controller may calculate the resistance value of the variable resistance based on a numeric value of the driving condition, and may change the resistance value of the variable resistance to the calculated resistance value.

The circuit for driving a switching module, and the system for driving a switching module according to example embodiments may have the following advantages.

Firstly, as the detection circuit for detecting the protection voltage of the switching module has its voltage controlled through a control of the variable resistance, a detection level of the protection voltage may be controlled.

As the detection level is controlled according to a driving condition of the switching module and a change of the driving condition, the switching module may be protected properly according to the driving condition of the switching module and the change of the driving condition.

Further, a saturation state may be precisely determined according to a driving condition of the switching module and a change of the driving condition, and the switching module may be protected. This may allow the switching module to be protected precisely and stably.

Further, as the detection level is controlled according to a driving condition of the switching module and a change of the driving condition, a condition to protect the switching module may have a wide range, and the switching module may be protected precisely and stably. This may enhance a reliability in driving the switching module.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A circuit for driving a switching module, comprising:
   a detection circuit for receiving a detection current for detecting a protection voltage to protect the switching module;
   a driving device configured to provide a driving signal for driving the switching module, to output the driving signal to the switching module, to detect the protection voltage based on voltage at the detection circuit, and to protect the switching module based on a detection result; and
   a controller configured to provide a command signal to the driving device, the driving device to provide the driving signal to the switching module based on the command signal,
   wherein the detection circuit includes a variable resistance having a resistance value that is variable by the controller,
   wherein the controller is to receive information of a driving condition of the switching module, and the controller is to control a detection level of the protection voltage by changing a resistance value of the variable resistance based on the driving condition of the switching module,
   wherein the protection voltage is a voltage obtained based on a voltage at the detection circuit and a saturation voltage between a collector and an emitter of the switching module, and
   wherein the driving device applies, to the detection circuit, the detection current for detecting the protection voltage, and the driving device detects the protection voltage based on a flow result of the detection current at the detection circuit and the switching module.

2. The circuit of claim 1, wherein the detection circuit is coupled to the collector of the switching module and is coupled to the driving device.

3. The circuit of claim 1, wherein the detection circuit includes one or more passive elements.

4. The circuit of claim 1, wherein the driving device compares the detection result with a preset reference value, and the driving device controls an output of the driving signal based on a comparison result.

5. The circuit of claim 1, wherein the driving condition of the switching module is an inner temperature of the switching module, or the driving condition of the switching module is a gating voltage between a gate and the emitter of the switching module.

6. The circuit of claim 1, further comprising a temperature sensor for detecting an inner temperature of the switching module, or a voltage sensor for detecting a gating voltage between a gate and the emitter of the switching module, and
   wherein the controller receives information regarding the driving condition from the temperature sensor or the voltage sensor.

7. The circuit of claim 6, wherein the controller is configured to:
   receive, from the temperature sensor, information regarding the inner temperature of the switching module,
   monitor the information regarding the inner temperature, and
   change the resistance value of the variable resistance based on a change of the inner temperature of the switching module.

8. The circuit of claim 6, wherein the controller is configured to:
   receive, from the voltage sensor, information regarding the gating voltage of the switching module,
   monitor the information regarding the gating voltage, and
   change the resistance value of the variable resistance based on a change of the gating voltage of the switching module.

9. The circuit of claim 1, wherein the controller is configured to:
   compare the driving condition of the switching module with a pre-stored table reference, and
   change the resistance value of the variable resistance to a value that is based on a comparison result.

10. The circuit of claim 1, wherein the controller is configured to:
    calculate the resistance value of the variable resistance based on a numeric value of the driving condition of the switching module, and
    change the resistance value of the variable resistance to the calculated resistance value.

11. A system for driving a switching module, comprising:
    one or more switching modules;
    a detection device for receiving a detection current for detecting a protection voltage;
    a driving device configured to provide a driving signal for driving the switching module, to detect the protection voltage based on voltage at the detection device, and to protect the switching module based on a detection result; and
    a controller configured to provide a command signal to the driving device, the driving device to provide the driving signal to the switching module based on the command signal,
    wherein the detection device includes a variable resistance that is variable by using the controller,
    wherein the controller is to receive information of a driving condition of the switching module, and the controller is to control a resistance value of the variable resistance based on the driving condition of the switching module, and thereby control a level of the protection voltage,
    wherein the protection voltage is a voltage obtained based on a voltage at the detection device and a saturation voltage between a collector and an emitter of the switching module, and
    wherein the driving device applies, to the detection device, the detection current for detecting the protection voltage, and the driving device detects the protection voltage based on a result of the detection current at the detection device and the switching module.

12. The system of claim 11, wherein the driving device compares the detection result with a preset reference value, and the driving device controls the driving signal based on a comparison result.

13. The system of claim 11, wherein the driving condition of the switching module is an inner temperature of the switching module, or the driving condition of the switching module is a gating voltage between a gate and the emitter of the switching module.

14. The system of claim 11, further comprising a temperature sensor for detecting an inner temperature of the switching module, or a voltage sensor for detecting a gating voltage between a gate and the emitter of the switching module, and
    wherein the controller receives information regarding the driving condition from the temperature sensor or the voltage sensor.

15. The system of claim 14, wherein the controller is configured to:
- receive, from the temperature sensor, information regarding the inner temperature of the switching module,
- monitor the information regarding the inner temperature, and
- change the resistance value of the variable resistance based on a change of the inner temperature of the switching module.

16. The system of claim 14, wherein the controller is configured to:
- receive, from the voltage sensor, information regarding the gating voltage of the switching module,
- monitor the information regarding the gating voltage, and
- change the resistance value of the variable resistance based on a change of the gating voltage of the switching module.

* * * * *